US008710605B2

(12) United States Patent
Takahashi et al.

(10) Patent No.: US 8,710,605 B2
(45) Date of Patent: Apr. 29, 2014

(54) MAGNETIC MEMORY AND METHOD OF MANUFACTURING THE SAME

(75) Inventors: Shigeki Takahashi, Yokohama (JP); Yuichi Ohsawa, Yokohama (JP); Junichi Ito, Yokohama (JP); Chikayoshi Kamata, Kawasaki (JP); Saori Kashiwada, Yokohama (JP); Minoru Amano, Sagamihara (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 13/231,894

(22) Filed: Sep. 13, 2011

(65) Prior Publication Data

US 2012/0074511 A1     Mar. 29, 2012

(30) Foreign Application Priority Data

Sep. 17, 2010   (JP) ................. 2010-210154

(51) Int. Cl.
  *H01L 29/72*   (2006.01)
(52) U.S. Cl.
  USPC ............ 257/427; 257/421; 257/E27.005; 257/E43.001; 257/E43.006
(58) Field of Classification Search
  USPC ............ 257/421, 427, E27.005, E43.001, 257/E43.006
  See application file for complete search history.

(56) References Cited

U.S. PATENT DOCUMENTS

| | | | |
|---|---|---|---|
| 6,165,803 A | 12/2000 | Chen et al. | |
| 6,297,983 B1 | 10/2001 | Bhattacharyya | |
| 6,365,286 B1 | 4/2002 | Inomata et al. | |
| 6,391,430 B1 | 5/2002 | Fullerton et al. | |
| 6,479,353 B2 | 11/2002 | Bhattacharyya | |
| 6,713,830 B2 | 3/2004 | Nishimura et al. | |
| 6,829,121 B2 | 12/2004 | Ikeda et al. | |
| 6,987,652 B2 | 1/2006 | Koganei | |
| 7,768,824 B2 | 8/2010 | Yoshikawa et al. | |

(Continued)

FOREIGN PATENT DOCUMENTS

| | | | |
|---|---|---|---|
| JP | 2000-156531 | | 6/2000 |
| JP | 2002-299727 | * | 10/2000 |

(Continued)

OTHER PUBLICATIONS

Albert, et al. 2000. Spin-polarized current switching of a Co thin film nanomagnet. *Applied Physics Letters*, 77(23):3809-3811.

(Continued)

*Primary Examiner* — Edward Wojciechowicz
(74) *Attorney, Agent, or Firm* — Knobbe, Martens, Olson & Bear, LLP

(57) ABSTRACT

A magnetic memory according to an embodiment includes: at least one memory cell comprising a magnetoresistive element as a memory element, and first and second electrodes that energize the magnetoresistive element. The magnetoresistive element includes: a first magnetic layer having a variable magnetization direction perpendicular to a film plane; a tunnel barrier layer on the first magnetic layer; and a second magnetic layer on the tunnel barrier layer, and having a fixed magnetization direction perpendicular to the film plane. The first magnetic layer including: a first region; and a second region outside the first region so as to surround the first region, and having a smaller perpendicular magnetic anisotropy energy than that of the first region. The second magnetic layer including: a third region; and a fourth region outside the third region, and having a smaller perpendicular magnetic anisotropy energy than that of the third region.

13 Claims, 13 Drawing Sheets

(56) References Cited

U.S. PATENT DOCUMENTS

| | | | |
|---|---|---|---|
| 7,957,184 | B2 | 6/2011 | Yoshikawa et al. |
| 8,139,405 | B2 | 3/2012 | Yoshikawa et al. |
| 8,154,915 | B2 | 4/2012 | Yoshikawa et al. |
| 8,218,355 | B2 | 7/2012 | Kitagawa et al. |
| 8,268,713 | B2 | 9/2012 | Yamagishi et al. |
| 2001/0022742 | A1 | 9/2001 | Bhattacharyya |
| 2002/0146851 | A1 | 10/2002 | Okazawa et al. |
| 2002/0167059 | A1 | 11/2002 | Nishimura et al. |
| 2002/0182442 | A1 | 12/2002 | Ikeda et al. |
| 2003/0067800 | A1 | 4/2003 | Koganei |
| 2005/0274997 | A1 | 12/2005 | Gaidis et al. |
| 2009/0080238 | A1 | 3/2009 | Yoshikawa et al. |
| 2009/0243008 | A1 | 10/2009 | Kitagawa et al. |
| 2010/0230770 | A1 | 9/2010 | Yoshikawa et al. |
| 2011/0037108 | A1 | 2/2011 | Sugiura et al. |
| 2011/0059557 | A1 | 3/2011 | Yamagishi et al. |
| 2011/0211389 | A1 | 9/2011 | Yoshikawa et al. |
| 2011/0222335 | A1 | 9/2011 | Yoshikawa et al. |
| 2013/0069186 | A1 | 3/2013 | Toko et al. |
| 2013/0181305 | A1* | 7/2013 | Nakayama et al. ........... 257/421 |

FOREIGN PATENT DOCUMENTS

| | | | |
|---|---|---|---|
| JP | 2001-308292 | | 11/2001 |
| JP | 2002-280640 | * | 9/2002 |
| JP | 2002-280640 | A | 9/2002 |
| JP | 2002-299727 | A | 10/2002 |
| JP | 2002-305290 | | 10/2002 |
| JP | 2003-110162 | A | 4/2003 |
| JP | 2003-536199 | | 12/2003 |
| JP | 2005-209951 | | 8/2005 |
| JP | 2006-005342 | | 1/2006 |
| JP | 2007-053315 | | 3/2007 |
| JP | 2008-153527 | | 7/2008 |
| JP | 2008-171882 | | 7/2008 |
| JP | 2008-193103 | A | 8/2008 |
| JP | 2009-081216 | A | 4/2009 |
| JP | 2009-239120 | * | 10/2009 |
| JP | 2009-239120 | A | 10/2009 |
| JP | 2011-040580 | | 2/2011 |
| JP | 2011-054873 | | 3/2011 |

OTHER PUBLICATIONS

Otani, et al. 2007. Microfabrication of magnetic tunnel junctions using $CH_3OH$ etching. *IEEE Transactions on Magnetics*, 43(6):2776-2778.
First Office Action mailed on Sep. 11, 2012 by Japan Patent Office in the corresponding Japanese patent application No. 2010-210154.
U.S. Appl. No. 13/604,537, filed Sep. 5, 2012, Nakayama et al.
U.S. Appl. No. 13/226,960, filed Sep. 7, 2011.
U.S. Appl. No. 13/226,868, filed Sep. 7, 2011.
Japanese Office Action dated Jan. 7, 2014 for Japanese Application No. 2011-205323.

* cited by examiner

MAGNETIC MEMORY AND METHOD OF MANUFACTURING THE SAME

CROSS REFERENCE TO RELATED APPLICATION

This application is based upon and claims the benefit of priority from prior Japanese Patent Application No. 2010-210154, filed on Sep. 17, 2010 in Japan, the entire contents of which are incorporated herein by reference.

FIELD

Embodiments described herein relate generally to a magnetic memory and a method of manufacturing the magnetic memory.

BACKGROUND

In the field of magnetic random access memories (MRAMs), a "spin torque transfer switching technique" for causing magnetization switching by applying a current to a magnetic material is well known.

By the spin torque transfer switching technique, a spin-injection current as a write current is applied to a magnetoresistive element, and spin-polarized electrons generated there are used to cause magnetization switching. Specifically, the angular momentum of the spin-polarized electrons is transmitted to the electrons in the magnetic material serving as the magnetic recording layer, so that the magnetization direction of the magnetic recording layer is reversed.

By using the spin torque transfer switching technique, local magnetization states can be readily controlled on a nanoscale. Further, the value of the spin-injection current can be made smaller with miniaturization of magnetic materials. This facilitates the realization of spin electronics devices such as high-recording-density hard disk drives and high-recording-density magnetic random access memories.

For example, a magnetic random access memory includes a magnetoresistive element as a memory element having a magnetic tunnel junction (MTJ) film that utilizes a tunneling magnetoresistive (TMR) effect. The MTJ film is formed with three film films: a recording layer and a reference layer made of magnetic materials, and a tunnel barrier layer interposed between the recording layer and the reference layer. The MTJ film stores information depending on the magnetization states of the recording layer and the reference layer. In a spin-injection MRAM using the spin torque transfer switching technique, information writing into a magnetoresistive element is performed by applying a current in a direction perpendicular to the film plane of the MTJ film.

Known magnetic layers that can be used in magnetoresistive elements include perpendicular magnetization films each having a magnetization direction in a direction perpendicular to the film plane, and in-plane magnetization films each having a magnetization direction in the in-plane direction. Where perpendicular magnetization films are used, the leak field generated by the magnetization of the reference layer is directed perpendicularly to the film plane of the recording layer, and therefore, a magnetic field having a large perpendicular component is applied to the recording layer. The leak current that is generated from the reference layer and is applied to the recording layer normally acts in such a direction that the magnetization of the recording layer is made parallel to the magnetization of the reference layer. If the recording layer is larger than the reference layer, however, the leak current generated from the reference layer is unevenly applied to the recording layer, and the spin torque transfer switching characteristics are degraded. Therefore, the size of the recording layer needs to be made as small as or smaller than the size of the reference layer.

By using the spin torque transfer switching technique, highly-integrated MRAMs can be realized. In doing so, however, the magnetoresistive elements of memory cells need to be made as small as several tens of nanometers in size. It is normally difficult to perform dry etching on materials that are used in magnetoresistive elements and contain magnetic metals such as Co and Fe. Therefore, the sidewalls cannot be formed almost vertically to achieve high integration. By forming the recording layer on the lower side (the substrate side), the magnetic characteristics of a magnetoresistive element using perpendicular magnetization films can be more improved. That is, if the sidewalls formed by performing conventional dry etching in a magnetoresistive element have small angles, the size of the recording layer becomes larger than the size of the reference layer, and therefore, the spin torque transfer switching characteristics are degraded as described above.

Further, each magnetoresistive element has a stacked structure in which a recording layer and a reference layer are stacked, with a thin tunnel barrier layer being interposed in between. In this stacked structure, the distance between the recording layer and the reference layer is short. When a magnetoresistive element is formed by processing such a stacked structure, the recording layer and the reference layer containing magnetic metals are trimmed as well as the tunnel barrier layer. As a result, the metals might redeposit to the entire sidewalls of the stacked structure across the tunnel barrier layer. In such a case, another leak current path is formed due to the redeposition, and the recording layer and the reference layer are short-circuited. As a result, defective magnetoresistive elements are formed, and the magnetoresistive element yield becomes lower.

DETAILED DESCRIPTION

Figure 1:
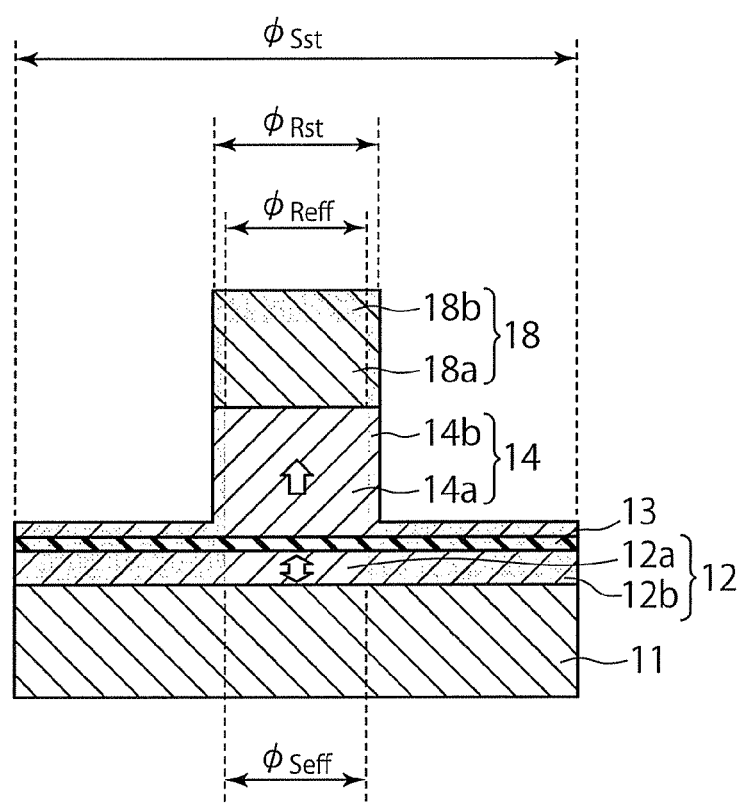
FIG. 1 is a cross-sectional view of a magnetoresistive element according to a first embodiment.

A magnetic memory according to an embodiment include: at least one memory cell comprising a magnetoresistive element as a memory element, and first and second electrodes that energize the magnetoresistive element. The magnetoresistive element includes: a first magnetic layer having a variable magnetization direction perpendicular to a film plane; a tunnel barrier layer on the first magnetic layer; and a second magnetic layer on the tunnel barrier layer, and having a fixed magnetization direction perpendicular to the film plane. The first magnetic layer including: a first region; and a second region outside the first region so as to surround the first region, and having a smaller perpendicular magnetic anisotropy energy than that of the first region. The second magnetic layer including: a third region; and a fourth region outside the third region so as to surround the third region, and having a smaller perpendicular magnetic anisotropy energy than that of the third region.

The following is a description of embodiments of the present invention, with reference to the accompanying drawings. In the following description, components having the same functions and structures are denoted by the same reference numerals, and explanation of them will be repeated only when necessary.

First Embodiment

First, a magnetic memory (hereinafter also referred to as MRAM) according to a first embodiment is described. The MRAM of the first embodiment includes at least one memory cell. Where a MRAM includes more than one memory cell, the memory cells are arranged in a matrix fashion. Each of the memory cells includes a magnetoresistive element as a memory element, and such a magnetoresistive element is shown in FIG. 1. FIG. 1 is a cross-sectional view of the magnetoresistive element 10 according to the first embodiment. The magnetoresistive element 10 has a stacked structure that is formed by stacking a base layer 11 including a lower electrode, a recording layer 12 formed on the base layer 11, a tunnel barrier layer 13 formed on the recording layer 12, a reference layer 14 formed on the tunnel barrier layer 13, and an upper electrode 18. In this embodiment, the base layer 11 is a single layer that serves as a lower electrode and a leading wire. However, the base layer and the lower electrode may be stacked separately from each other, or the base layer and the lower electrode may be formed as a single layer while the leading wire is stacked independently of the others. The upper electrode 18 also functions as a hard mask layer.

The recording layer 12 has a magnetization (or spin) direction that is switched when the angular momentum of spin-polarized electrons is transmitted to the electrons in the recording layer 12. The spin-polarized electrons are generated by applying a current to a MTJ film in a direction perpendicular to the film plane. The MTJ film is formed by the recording layer 12, the tunnel barrier layer 13, and the reference layer 14. The magnetization direction of the recording layer 12 changes depending on the direction in which a current flows. It should be noted that, in this specification, the "film plane" is the upper face of each subject film.

On the other hand, the magnetization direction of the reference layer 14 is fixed. By the "fixed" magnetization direction of the reference layer 14, it is meant that the magnetization direction of the reference layer 14 does not change when a magnetization switching current for reversing the magnetization direction of the recording layer 12 is applied to the reference layer 14. Therefore, in the magnetoresistive element 10, a magnetic layer having a large switching current is used as the reference layer 14, and a magnetic layer having a smaller switching current than that of the reference layer 14 is used as the recording layer 12. With this arrangement, the magnetoresistive element 10 including the recording layer 12 having a variable magnetization direction and the reference layer 14 having a fixed magnetization direction can be realized. When magnetization switching is to be caused by spin-polarized electrons, the switching current is proportional to the damping constant, the anisotropy field, and the volume of the MTJ film. Therefore, by adjusting those values in an appropriate manner, a difference in switching current can be caused between the recording layer 12 and the reference layer 14. It should be noted that the arrows shown in FIG. 1 indicate magnetization directions.

The recording layer 12 and the reference layer 14 each have magnetic anisotropy in a direction perpendicular to the film plane. Accordingly, the easy magnetization directions of the recording layer 12 and the reference layer 14 are perpendicular to the film planes (hereinafter referred to as "perpendicular magnetization"). That is, the magnetoresistive element 10 is a so-called perpendicular-magnetization magnetoresistive element in which each of the magnetization directions of the recording layer 12 and the reference layer 14 is in a direction perpendicular to the film plane. It should be noted that an "easy magnetization direction" is the direction in which a macro-size ferromagnetic material has the lowest internal energy when the spontaneous magnetization direction of the macro-size ferromagnetic material is the same as the direction when there is no external magnetic fields. On the other hand, a "hard magnetization direction" is the direction in which a macro-size ferromagnetic material has the largest internal energy when the spontaneous magnetization direction of the macro-size ferromagnetic material is the same as the direction when there are no external magnetic fields.

In this embodiment, as shown in FIG. 1, magnetically-inactive and electrically-inactive impurity regions 12b and 14b into which impurities such as N (nitrogen) or O (oxygen) are implanted are formed on the respective outer peripheral portions of the recording layer 12 and the reference layer 14, and magnetically-active and electrically-active center regions 12a and 14a are formed inside the impurity regions 12b and 14b. That is, the recording layer 12 includes the magnetically-active and electrically-active center region 12a formed inside, and the impurity region 12b that is formed to surround the center region 12a and is more magnetically-inactive and electrically-inactive than the center region 12a. Likewise, the reference layer 14 includes the magnetically-active and electrically-active center region 14a formed inside, and the impurity region 14b that is formed to surround the center region 14a and is more magnetically-inactive and electrically-inactive than the center region 14a. The impurity region 12b of the recording layer 12 has a smaller perpendicular magnetic anisotropy energy than that of the center region 12a, and the impurity region 14b of the reference layer 14 has a smaller perpendicular magnetic anisotropy energy than that of the center region 14a. For example, the perpendicular magnetic anisotropy energy of each of the impurity regions of the recording layer 12 and the reference layer 14 is preferably at least one digit smaller than the perpendicular magnetic anisotropy energy of each corresponding center region. In this embodiment, a region 18b into which impurities are implanted is also formed on the upper face and sidewalls of the upper electrode 18, and a region 18a into which no impurities are implanted is formed inside the region 18b. Further, the center regions 12a and 14a have magnetization directions substantially perpendicular to the film planes.

In this embodiment having the above described structure, the diameter $\phi_{Sst}$ of the recording layer 12 or the outer diameter $\phi_{Sst}$ of the impurity region 12b of the recording layer 12 is larger than the diameter $\phi_{Seff}$ of the magnetically-active and electrically-active center region 12a of the recording layer 12. At this point, a "diameter" means the largest value of the distance between two points on the outer periphery in a cross-section taken along a plane parallel to the film plane. For example, if the cross-section is rectangular, the "diameter" is equal to the length of each diagonal line. If the cross-section has an elliptical shape, the "diameter" is equal to the length of the long axis. Further, the diameter $\phi_{Rst}$ of the reference layer 14 or the outer diameter $\phi_{Rst}$ of the impurity region 14b of the reference layer 14 is larger than the diameter $\phi_{Reff}$ of the magnetically-active and electrically-active center region 14a of the reference layer 14. Thus, in this embodiment illustrated in FIG. 1, the diameter $\phi_{Reff}$ of the center region 14a of the reference layer 14 and the diameter $\phi_{Seff}$ of the center region 12a of the recording layer 12 are designed to be substantially the same from the upper face to the lower face.

Figure 2:
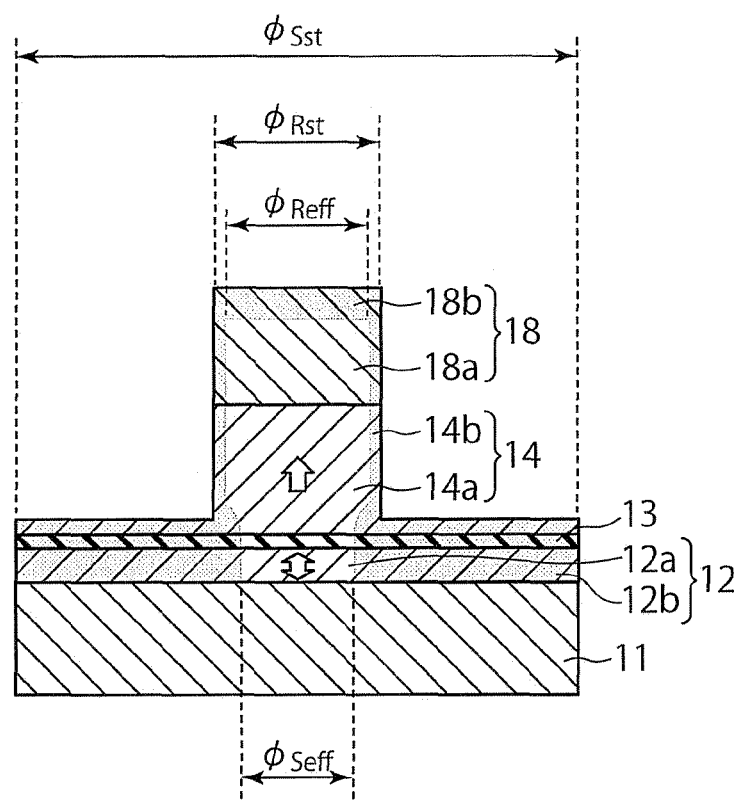
FIG. 2 is a cross-sectional view of a magnetoresistive element according to a first modification of the first embodiment.

However, as in a magnetoresistive element 10A according to a first modification of this embodiment, the diameter $\phi_{Seff}$ of the center region 12a of the recording layer 12 may be smaller than the diameter $\phi_{Reff}$ of the center region 14a of the reference layer 14, as shown in FIG. 2. As in this embodiment and the first modification, the diameter $\phi_{Seff}$ of the magnetically-active and electrically-active center region 12a of the recording layer 12 is made equal to or smaller than the diameter $\phi_{Reff}$ of the magnetically-active and electrically-active center region 14a of the reference layer 14, so that the influence of a leak field from the reference layer 14 on the recording layer 12 can be reduced.

When attention is paid to the impurity region 12b of the recording layer 12 and the impurity region 14b of the reference layer 14, the following facts can also be observed. In the magnetoresistive element 10 of this embodiment illustrated in FIG. 1 and the magnetoresistive element 10A of the first modification illustrated in FIG. 2, the mean size of the impurity region 12b of the recording layer 12 in the film thickness direction thereof is larger than the mean size of the impurity region 14b of the reference layer 14 in the film thickness direction thereof. At this point, the "mean size of an impurity region in the film thickness direction thereof" is the value of the mean "in-plane size" of the impurity region in the film thickness direction of the impurity region, and an "in-plane size" of the impurity region is the mean value between the outer diameter of the impurity region and the diameter of the center region surrounded by the impurity region in a plane of a cross-section of the impurity region taken along the plane parallel to the film plane. In the magnetoresistive element 10 of this embodiment illustrated in FIG. 1 and the magnetoresistive element 10A of the first modification illustrated in FIG. 2, the reference layer 14 includes a first portion that is in contact with the tunnel barrier layer 12 and has the same diameter as the recording layer 12, and a second portion that is formed on the first portion and has a smaller diameter than that of the first portion. Therefore, the mean size of the impurity region 14b of the reference layer 14 in the film thickness direction thereof is smaller than the mean size of the impurity region 12b of the recording layer 12 in the film thickness direction thereof. That is, the mean size of the impurity region 12b of the recording layer 12 in the film thickness direction thereof is larger than the mean size of the impurity region 14b of the reference layer 14 in the film thickness direction thereof. With this arrangement, a reduction in the magnetic anisotropy energy Ku of the recording layer 12 due to stress applied to the recording layer 12 when the magnetoresistive element is covered with an insulating film can be restrained. This effect can be explained as follows.

Generally, the resistance of a magnetic layer to thermal disturbance is expressed as KuV, where Ku represents the magnetic anisotropy energy of the magnetic layer, and V represents the volume of the magnetic layer. Since writing is performed on the recording layer 12, the recording layer 12 is designed to have a smaller magnetic anisotropy energy than that of the reference layer 14. As described above, since a magnetoresistive element is covered with an insulating film, stress is applied from the insulating film to the recording layer and the reference layer, and the magnetic anisotropy energy Ku of each layer becomes smaller. The recording layer is designed to have a smaller magnetic anisotropy energy than that of the reference layer, and therefore, the influence of the stress is larger on the recording layer. As in the first embodiment and the first modification, the mean size of the impurity region 12b of the recording layer 12 in the film thickness direction thereof is made larger than the mean size of the impurity region 14b of the reference layer 14 in the film thickness direction thereof, or the recording layer 12 has the larger impurity region serving as the buffer region against the stress. Thus, a reduction in the magnetic anisotropy energy Ku in the center region 12a of the recording layer 12 can be restrained.

It should be noted that the mean size of the impurity region 12b of the recording layer 12 in the film thickness direction thereof is also larger than the mean size of the impurity region 14b of the reference layer 14 in the film thickness direction thereof in the later described second through sixth modifications of the first embodiment.

Next, the materials of the respective layers used in this embodiment, the first modification, and the later described second through sixth modifications are described.

The above described base layer 11 is formed by a thick metal layer serving as a lower electrode, and a buffer layer for growing a flat magnetic layer having perpendicular magnetization. For example, the base layer 11 has a stacked structure formed by stacking metal layers such as a tantalum (Ta) layer, a copper (Cu) layer, a ruthenium (Ru) layer, or an iridium (Ir) layer.

Examples of the materials of the recording layer 12 and the reference layer 14 include a ferromagnetic material having a $L1_0$ structure or a $L1_1$ structure such as FePd, FePt, CoPd, or CoPt, a ferromagnetic material such as TbCoFe, and a superlattice formed by a stacked structure of a magnetic material such as NiFe or Co and a nonmagnetic material such as Cu, Pd, or Pt.

The tunnel barrier layer 13 is made of an insulating material such as magnesium oxide (MgO) or aluminum oxide ($Al_2O_3$).

The upper electrode (the hard mask layer) 15 is made of a metal such as tantalum (Ta) or tungsten (W), or a conductive compound such as titanium nitride (TiN), titanium silicon nitride (TiSiN), or tantalum silicon nitride (TaSiN).

It should be noted that the recording layer 12 and the reference layer 14 each has magnetic anisotropy in a direction parallel to the film plane. Accordingly, the easy magnetization directions of the recording layer 12 and the reference layer 14 may be made parallel to the film plane (or the stacked layer plane), depending on required properties (the magnetization being hereinafter referred to as in-plane magnetization).

The material of the recording layer and the reference layer having in-plane magnetization may be a magnetic metal containing at least one element selected from the group consisting of iron (Fe), cobalt (Co), nickel (Ni), manganese (Mn), and chromium (Cr).

In each of the magnetoresistive elements according to this embodiment, the first modification, and the later described second through sixth modifications, information writing is performed as follows. At the time of information writing, the magnetoresistive element 10 is bidirectionally energized in a direction perpendicular to the film plane.

When a write current is applied in the direction from the recording layer 12 toward the reference layer 14, electrons flow in the direction from the reference layer 14 toward the recording layer 12. In this case, a spin torque is applied in such a direction that the magnetization direction of the recording layer 12 becomes the same as the magnetization direction of the reference layer 14. Therefore, when the magnetization direction of the recording layer 12 is antiparallel to the magnetization direction of the reference layer 14, the magnetization direction of the recording layer 12 is reversed to be parallel to (or the same as) the magnetization direction of the reference layer 14.

When a write current is applied in the direction from the reference layer 14 toward the recording layer 12, on the other hand, electrons flow in the direction from the recording layer 12 toward the reference layer 14. In this case, a spin torque is applied in such a direction that the magnetization direction of the recording layer 12 becomes antiparallel to the magnetization direction of the reference layer 14. Therefore, when the magnetization direction of the recording layer 12 is parallel to the magnetization direction of the reference layer 14, the magnetization direction of the recording layer 12 is reversed to be antiparallel to the magnetization direction of the reference layer 14.

When a read current flowing in a direction perpendicular to the film plane is applied to the magnetoresistive element 10, the resistance value varies depending on the relative direction of magnetization between the recording layer 12 and the reference layer 14, because of the magnetoresistive effect. That is, when the magnetization directions of the recording layer 12 and the reference layer 14 are parallel to each other, the resistance value of the magnetoresistive element 10 is low. When the magnetization directions are antiparallel to each other, the resistance value is high. In FIG. 1, when the magnetization direction of the recording layer 12 is the upward direction, the magnetoresistive element 10 is in a parallel state. When the magnetization direction of the recording layer 12 is the downward direction, the magnetoresistive element 10 is in an antiparallel state. In this embodiment, the low-resistance state is defined as data "0", and the high-resistance state is defined as data "1", for example. With this arrangement, 1-bit information can be stored in the magnetoresistive element 10. It should be noted that the low-resistance state may be defined as the data "1", and the high-resistance state may be defined as the data "0".

The value defined by "(R1−R0)/R0", where R0 represents the resistance value in the parallel state, and R1 represents the resistance value in the antiparallel state, is called the magnetoresistance ratio (MR ratio). The MR ratio varies depending on the materials constituting the magnetoresistive element 10 and the process conditions for the magnetoresistive element 10, but may be in the range of several tens of percent to several hundreds of percent. A MRAM reads information stored in the magnetoresistive element 10, using the magnetoresistive effect. The read current to be applied to the magnetoresistive element 10 in a reading operation is set at a sufficiently smaller current value than the current with which the magnetization direction of the recording layer 12 is reversed by spin injection.

(Second Modification)

Figure 3:
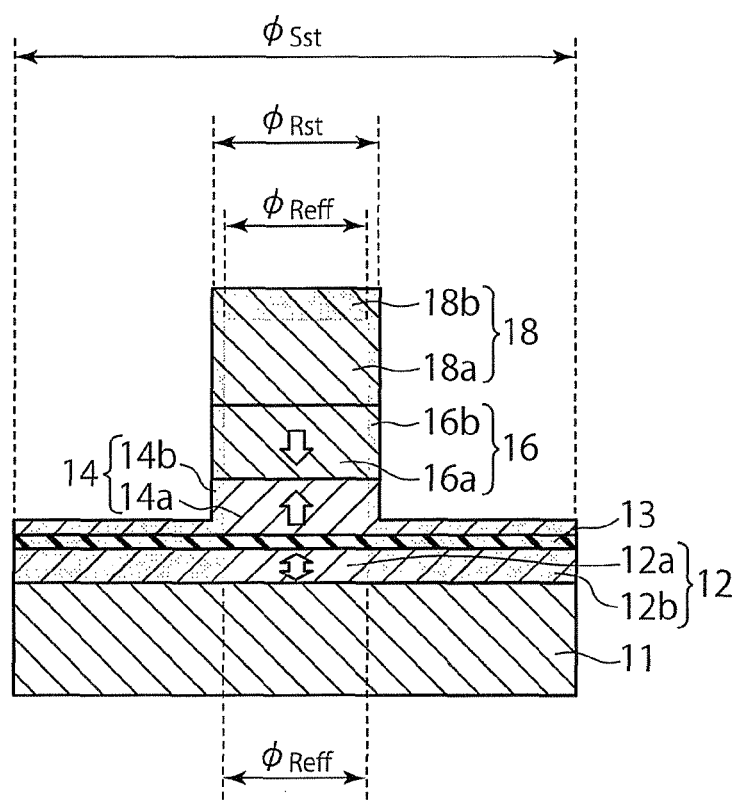
FIG. 3 is a cross-sectional view of a magnetoresistive element according to a second modification of the first embodiment.

FIG. 3 shows a magnetoresistive element according to a second modification of the first embodiment. The magnetoresistive element 10B according to the second modification is the same as the magnetoresistive element 10 of the first embodiment shown in FIG. 1, except that a bias layer 16 is provided between the reference layer 14 and the upper electrode 18. The bias layer 16 is a layer that has perpendicular magnetization fixed in the opposite direction from the magnetization direction of the reference layer 14. The bias layer 16 eliminates the influence of a leak field from the reference layer 14 onto the recording layer 12, and enables switching in a state where there are almost no external magnetic fields. As shown in FIG. 3, the bias layer 16 includes a magnetically-active and electrically-active center region 16a formed inside, and an impurity region 16b formed to surround the center region 16a. The impurity region 16b has impurities such as N (nitrogen) or O (oxygen) implanted thereinto, and is more magnetically-inactive and electrically-inactive than the center region 16a.

The bias layer 16 can also be used in the first modification, and can also be used in the later described third through sixth modifications.

(Third Modification)

Figure 4:
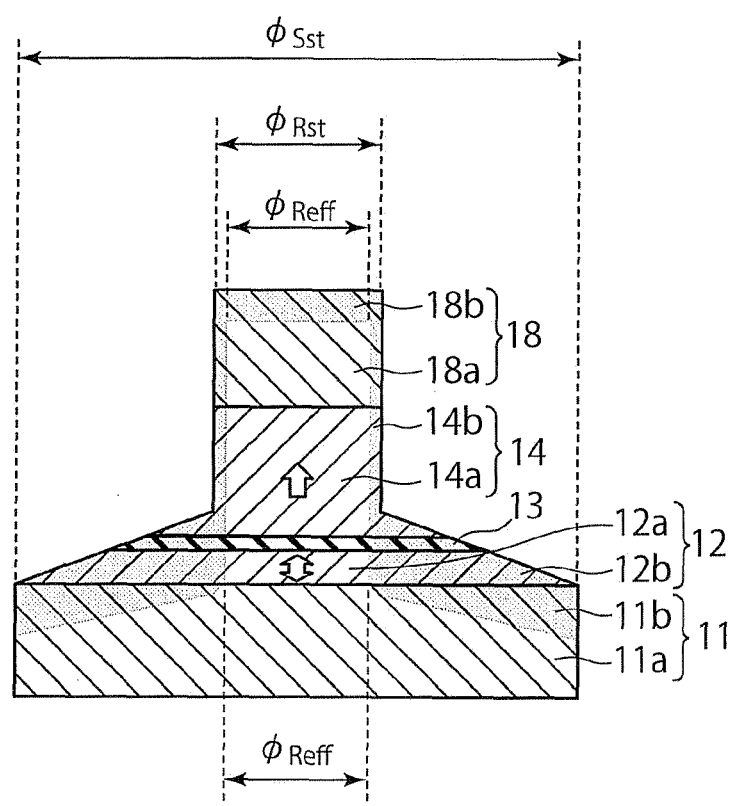
FIG. 4 is a cross-sectional view of a magnetoresistive element according to a third modification of the first embodiment.

FIG. 4 shows a magnetoresistive element according to a third modification of this embodiment. The magnetoresistive element 10C according to the third modification is the same as the magnetoresistive element 10 of the first embodiment shown in FIG. 1, except that the sidewalls of the recording layer 12 and the tunnel barrier layer 13, and part of the sidewalls of the reference layer 14 are designed to have a small taper angle.

Generally, when conventional RIE (Reactive Ion Etching) is used for performing dry etching on a magnetic metal, an effective volatile reaction product is not formed, and preferable anisotropic etching cannot be performed. Therefore, ion beam etching (IBE) that has low material selectivity among various kinds of magnetic metals and causes no metal corrosions is used in the process for manufacturing magnetic devices. In IBE, physical sputter etching is performed. Therefore, to form almost vertical sidewalls, the ion beam to be emitted is tilted with respect to the direction perpendicular to the substrate surface, and etching is performed while the substrate is rotated. In doing so, the gently tapered shape shown in FIG. 4 is formed at the lower portion of the almost vertical side walls due to the influence of the oblique incidence on the three-dimensional structure and the shaded portion. That is, the magnetoresistive element 10C according to the third modification shown in FIG. 4 is formed by using IBE in the etching of the MTJ film.

In the structure of the third modification, the impurity regions 12b and 14b having impurities such as N or O implanted thereinto are also formed in the recording layer 12 and the reference layer 14. The diameter $\phi_{Sst}$ of the recording layer 12 is larger than the diameter $\phi_{Seff}$ of the magnetically-active and electrically-active center region 12a of the recording layer 12, and the diameter $\phi_{Rst}$ of the reference layer 14 is larger than the diameter $\phi_{Reff}$ of the magnetically-active and electrically-active center region 14a of the reference layer 14. In the third modification, an impurity region 11b having impurities such as N or O implanted thereinto is also formed in the base layer 11, and a region 11a having no impurities implanted thereinto exists inside the impurity region 11b.

(Fourth Modification)

Figure 5:
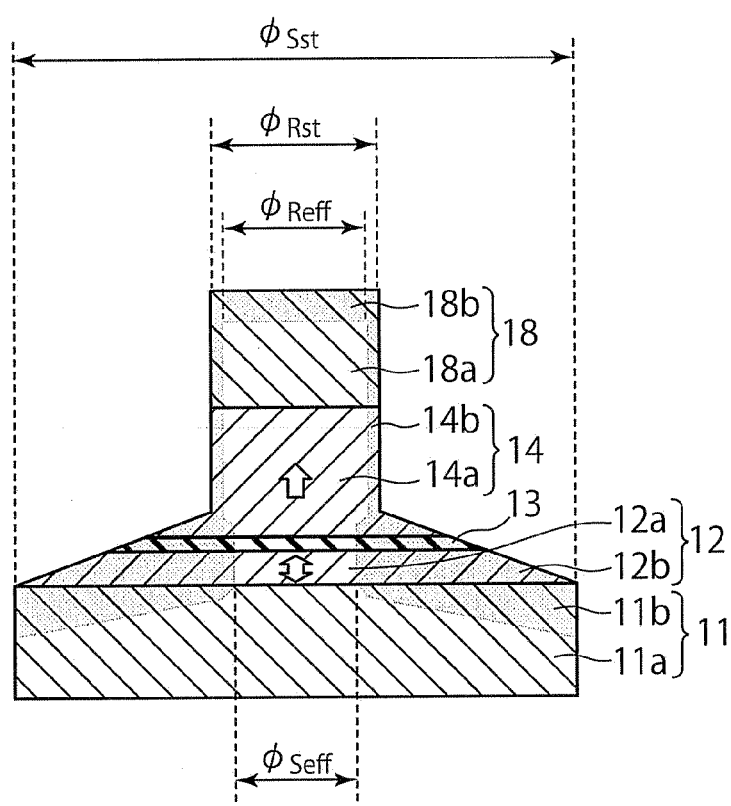
FIG. 5 is a cross-sectional view of a magnetoresistive element according to a fourth modification of the first embodiment.

FIG. 5 shows a magnetoresistive element according to a fourth modification of this embodiment. The magnetoresistive element 10D according to the fourth modification is the same as the magnetoresistive element 10C according to the third modification shown in FIG. 4, except that the diameter $\phi_{Seff}$ of the center region 12a of the recording layer 12 is smaller than the diameter $\phi_{Reff}$ of the center region 14a of the reference layer 14 as in the first modification shown in FIG. 2. The advantages of this structure are described below.

Figure 6:
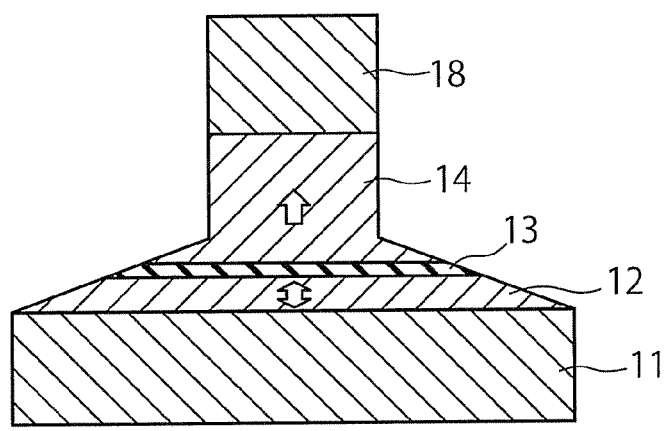
FIG. 6 is a cross-sectional view of a magnetoresistive element according to a comparative example of the first embodiment.

FIG. 6 shows a magnetoresistive element according to a comparative example. In the magnetoresistive element of this comparative example, the diameters of the recording layer 12, the tunnel barrier layer 13, and the reference layer 14 are substantially the same as the diameters of the magnetically-active and electrically-active regions. In the processing performed to form this shape, the recording layer 12 and the reference layer 14, as well as the tunnel barrier layer 13, are trimmed, and therefore, the magnetic metals contained in the recording layer 12 and the reference layer 14 might redeposit to the entire tunnel barrier layer 13. In such a case, a path for another leak current due to the redeposition is formed, and the recording layer 12 and the reference layer 14 are short-circuited. As a result, the magnetoresistive element has failures in operation, and the magnetoresistive element yield becomes lower.

Further, when the diameters of the recording layer 12, the tunnel barrier layer 13, and the reference layer 14 are substantially the same as the diameters of the magnetically-active and electrically-active regions, elements are formed while the damage from the processing still remains in the end portions of the elements, and therefore, the reliability in operations of the elements might become poorer. That is, the electromigration at the processed interfaces with the recording layer 12 and the reference layer 14 causes atomic migration, and the perpendicular magnetic anisotropy might be degraded due to a change in composition of the magnetic metal. Therefore, spin torque transfer switching occurs, based on the regions in which the perpendicular magnetic anisotropy at the processed interfaces is degraded. As a result, the switching current distribution might become larger, and the recording retention characteristics might be degraded.

In this embodiment and its modifications, on the other hand, the impurity regions 12b and 14b having impurities such as N or O implanted thereinto are formed on the outer peripheries of the recording layer 12 and the reference layer 14. That is, the diameter $\phi_{Sst}$ of the recording layer 12 is larger than the diameter $\phi_{Seff}$ of the magnetically-active and electrically-active center region 12a of the recording layer 12, and the diameter $\phi_{Rst}$ of the reference layer 14 is larger than the diameter $\phi_{Reff}$ of the magnetically-active and electrically-active center region 14a of the reference layer 14. Therefore, even when redeposition is formed between the recording layer 12 and the reference layer 14, the surfaces of the recording layer 12 and the reference layer 14 are electrically inactive, and a short-circuiting path that causes short-circuiting between the recording layer 12 and the reference layer 14 is not formed.

Further, when the tunnel barrier layer 13 is processed, the processing energy is normally accumulated, and damages the sidewalls of the tunnel barrier layer 13. This damage might cause an insulation failure, resulting in a leak path. In a structure according to this embodiment or one of its modifications, however, insulation properties can be maintained even if the sidewalls of the tunnel barrier layer 13 are damaged. Accordingly, a reduction in magnetoresistive element yield can be restrained.

In the recording layer 12 and the reference layer 14 in this embodiment, a preferred concentration of the N impurity in the impurity regions 12b and 14b having impurities such as N or O implanted thereinto is approximately 1 atomic % or higher. When a ferromagnetic material having a $L1_0$ structure or a $L1_1$ structure such as CoPd or CoPt is used as the recording layer material, the N impurity concentration is equivalent to an impurity concentration of approximately $10^{20}$ cm$^{-3}$ or higher.

In this embodiment and its modifications, where the recording layer 12 and the reference layer 14 are inactive, the following facts are observed. The magnetization of the magnetically-active center region 12a of the recording layer 12 is substantially in a perpendicular direction, and causes a magnetoresistive effect. If the magnetization of the magnetically-inactive impurity region 12b formed outside the center region 12a of the recording layer 12 is almost zero at this point, no magnetostatic interactions affect the center regions 12a and 14a of the recording layer 12 and the reference layer 14, and the impurity region 12b cause no problems as a magnetically-inactive region. Even if the magnetization of the impurity region 12b does not become zero, the magnetization of the impurity region 12b serves as circular magnetization as long as the magnetization of the impurity region 12b is in-plane magnetization. Accordingly, no magnetostatic interactions affect the center regions 12a and 14a of the recording layer 12 and the reference layer 14, and the impurity region 12b can fulfill the purpose of a magnetically-inactive region. The condition for the impurity region 12b not to become perpendicular is that the perpendicular magnetic anisotropy energy becomes smaller than the demagnetizing field energy, which is expressed as: $Ku \leq 2\pi Ms^2$. Here, Ku represents the perpendicular magnetic anisotropy energy, and Ms represents the saturation magnetization. In this case, however, no exchange interactions should affect the regions where the center regions 12a and 14a of the recording layer 12 and the reference layer 14 are in contact with the impurity region 12b. The implanted impurities such as N are normally segregated at the crystal grain boundaries of the magnetic metals of the recording layer 12 and the reference layer 14. Therefore, exchange interactions with active regions having no impurities implanted thereinto disappear in many cases.

In this embodiment and its modifications, where the recording layer 12 and the reference layer 14 are electrically inactive, the following facts are observed. The current flowing in the electrically-inactive regions 12b and 14b of the recording layer 12 and the reference layer 14 should be approximately 1% or less of the total current flowing in the electrically-active regions 12a and 14a. When the cross-sectional area of the electrically-inactive region 12b is larger than the cross-sectional area of the electrically-active region 12a as in the recording layer 12, the resistance value of the electrically-inactive region 12b needs to be at least two digits larger than the resistance value of the electrically-active region 12a. On the other hand, when the cross-sectional area of the electrically-inactive region 14b is smaller than the cross-sectional area of the electrically-active region 14a as in the reference layer 14, the resistance value of the electrically-inactive region 14b does not need to be two digits larger than the resistance value of the electrically-active region 14a.

Further, the damaged layers at the processed interfaces with the recording layer 12 and the reference layer 14 are made nonmagnetic and are made to have high resistance because of the impurity regions 12b and 14b having impurities such as N or O implanted thereinto, and cease to contribute to spin torque transfer switching. Specifically, as the current flowing in the damaged layers at the processed interfaces of magnetic materials is reduced, the probability of electromigration becomes zero, and a reduction in reliability of the magnetoresistive element can be restrained.

(Fifth Modification)

Figure 7:
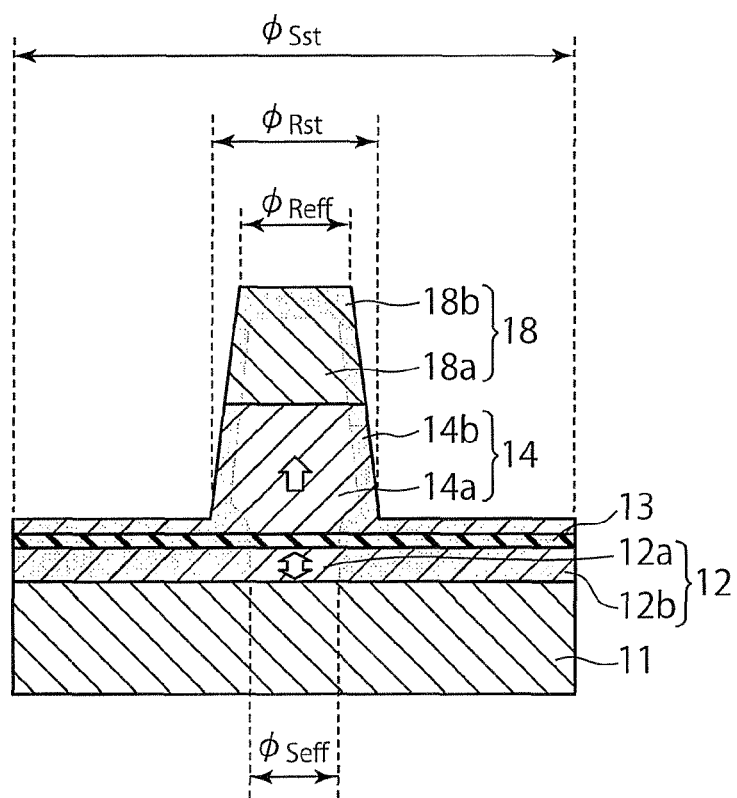
FIG. 7 is a cross-sectional view of a magnetoresistive element according to a fifth modification of the first embodiment.

FIG. 7 shows a magnetoresistive element according to a fifth modification of this embodiment. The magnetoresistive element 10E according to the fifth modification is the same as the magnetoresistive element 10A of the first modification shown in FIG. 2, except that the sidewalls of the reference layer 14 and the upper electrode 18 are slightly tilted with respect to the vertical direction. As described above, by conventional RIE in performing dry etching on a magnetic metal, preferable anisotropic etching cannot be performed. Therefore, such a shape that is slightly tilted with respect to the vertical direction is often used. In this structure, the impurity regions 12b and 14b having impurities such as N or O implanted thereinto are also formed in the recording layer 12 and the reference layer 14. The diameter $\phi_{Sst}$ of the recording layer 12 is larger than the diameter $\phi_{Seff}$ of the magnetically-active and electrically-active center region 12a of the recording layer 12, and the diameter $\phi_{Rst}$ of the reference layer 14 is larger than the diameter $\phi_{Reff}$ of the magnetically-active and electrically-active center region 14a of the reference layer 14. However, in the shape slightly tilted from the vertical direction as in the fifth modification, the diameter $\phi_{Rst}$ of the reference layer 14 and the diameter $\phi_{Reff}$ of the magnetically-active and electrically-active region of the reference layer 14 are not uniquely determined. Therefore, in this modification, when the diameter $\phi_{Rst}$ of the reference layer 14 is larger than the diameter $\phi_{Reff}$ of the magnetically-active and electrically-active center region 14a of the reference layer 14 in all cross-sections taken along planes parallel to the film plane, the diameter $\phi_{Rst}$ of the reference layer 14 is defined as larger than the diameter $\phi_{Reff}$ of the magnetically-active and electrically-active center region 14a of the reference layer 14. By doing so, the same effects as the above described effects of this embodiment can be achieved.

Further, in the fifth modification, the diameter $\phi_{Seff}$ of the magnetically-active and electrically-active center region 12a of the recording layer 12 is designed to be smaller than the diameter $\phi_{Reff}$ of the magnetically-active and electrically-active center region 14a of the reference layer 14.

(Sixth Modification)

Figure 8:
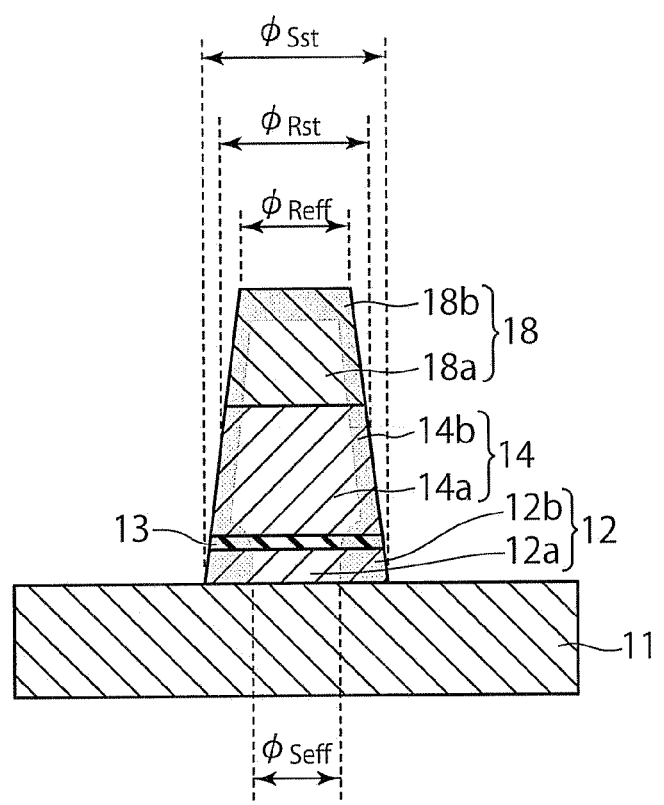
FIG. 8 is a cross-sectional view of a magnetoresistive element according to a sixth modification of the first embodiment.

FIG. 8 shows a magnetoresistive element according to a sixth modification of this embodiment. The magnetoresistive element 10F according to the sixth modification is the same as the magnetoresistive element 10A of the first modification shown in FIG. 2, except that the sidewalls of the recording layer 12, the tunnel barrier layer 13, the reference layer 14, and the upper electrode 18 are slightly tilted with respect to the vertical direction. In the sixth modification, the dry etching performed in the fifth modification shown in FIG. 7 is further performed down to the recording layer 12. In the sixth modification, the diameter $\phi_{Rst}$ of the reference layer 14, the diameter $\phi_{Reff}$ of the magnetically-active and electrically-active center region 14a of the reference layer 14, the diameter $\phi_{Sst}$ of the recording layer 12, and the diameter $\phi_{Seff}$ of the magnetically-active and electrically-active center region 12a of the recording layer 12 are not uniquely determined as in the fifth modification shown in FIG. 7. In this modification, when the diameter $\phi_{Rst}$ of the reference layer 14 is larger than the diameter $\phi_{Reff}$ of the magnetically-active and electrically-active center region 14a of the reference layer 14 in all cross-sections taken along planes parallel to the film plane, the diameter $\phi_{Rst}$ of the reference layer 14 is defined as larger than the diameter $\phi_{Reff}$ of the magnetically-active and electrically-active center region 14a of the reference layer 14. Likewise, when the diameter $\phi_{Sst}$ of the recording layer 12 is larger than the diameter $\phi_{Seff}$ of the magnetically-active and electrically-active center region 12a of the recording layer 12 in all cross-sections taken along planes parallel to the film plane, the diameter $\phi_{Sst}$ of the recording layer 12 is defined as larger than the diameter $\phi_{Seff}$ of the magnetically-active and electrically-active center region 12a of the recording layer 12. By doing so, the same effects as the above described effects of this embodiment can be achieved.

Further, in the sixth modification, the diameter $\phi_{Seff}$ of the magnetically-active and electrically-active center region 12a of the recording layer 12 is designed to be smaller than the diameter $\phi_{Reff}$ of the magnetically-active and electrically-active center region 14a of the reference layer 14.

As described so far, according to this embodiment and its modifications, degradation of the spin torque transfer switching characteristics of magnetoresistive elements used in memory cells can be restrained, and magnetoresistive elements can be manufactured with a high yield.

Second Embodiment

Referring now to FIGS. 9(a) through 12(b), a method of manufacturing a magnetic memory (MRAM) according to a second embodiment is described. The MRAM to be manufactured by the manufacturing method according to this embodiment is a MRAM of the first embodiment including the magnetoresistive element 10 of FIG. 1 as a memory element.

Figure 9:
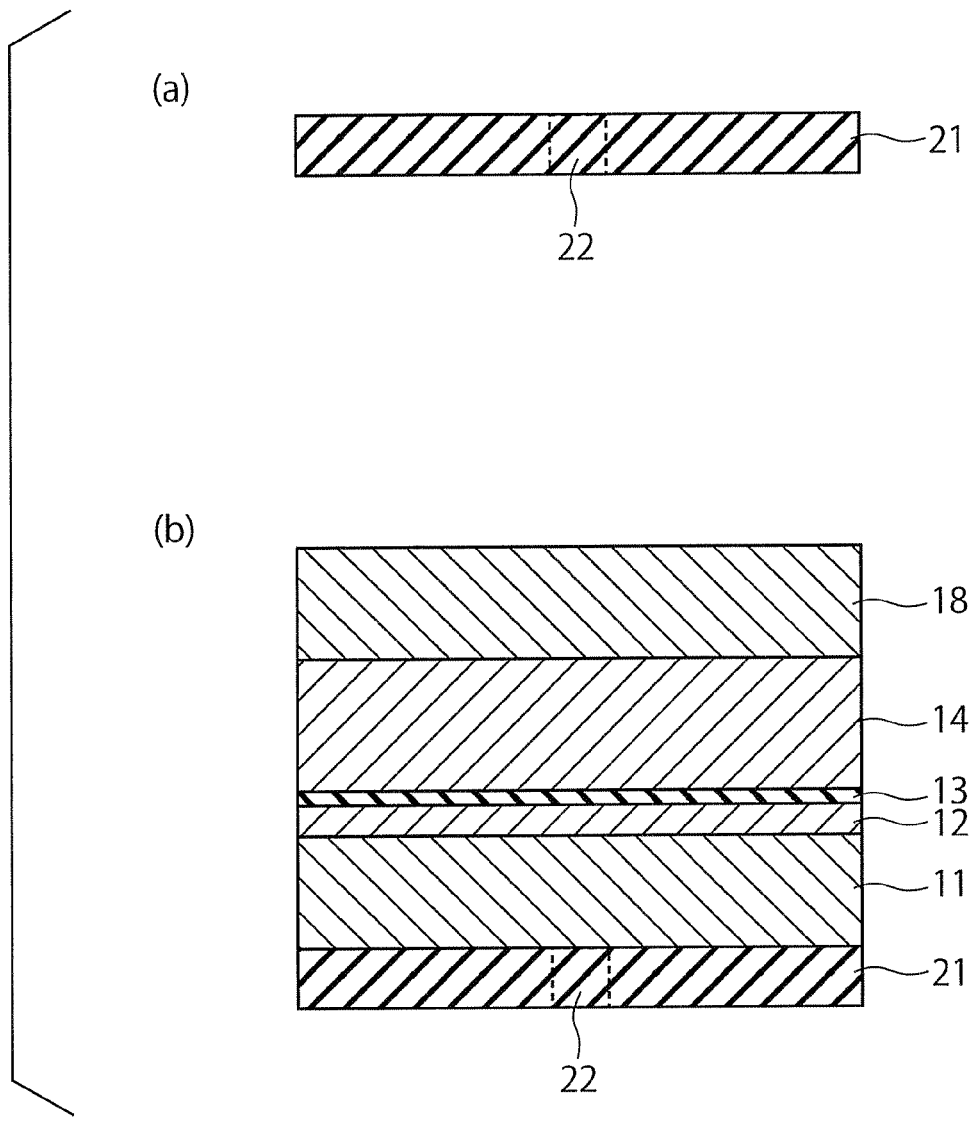
FIGS. 9(a) and 9(b) are cross-sectional views illustrating a manufacturing method according to a second embodiment.
Figure 10:
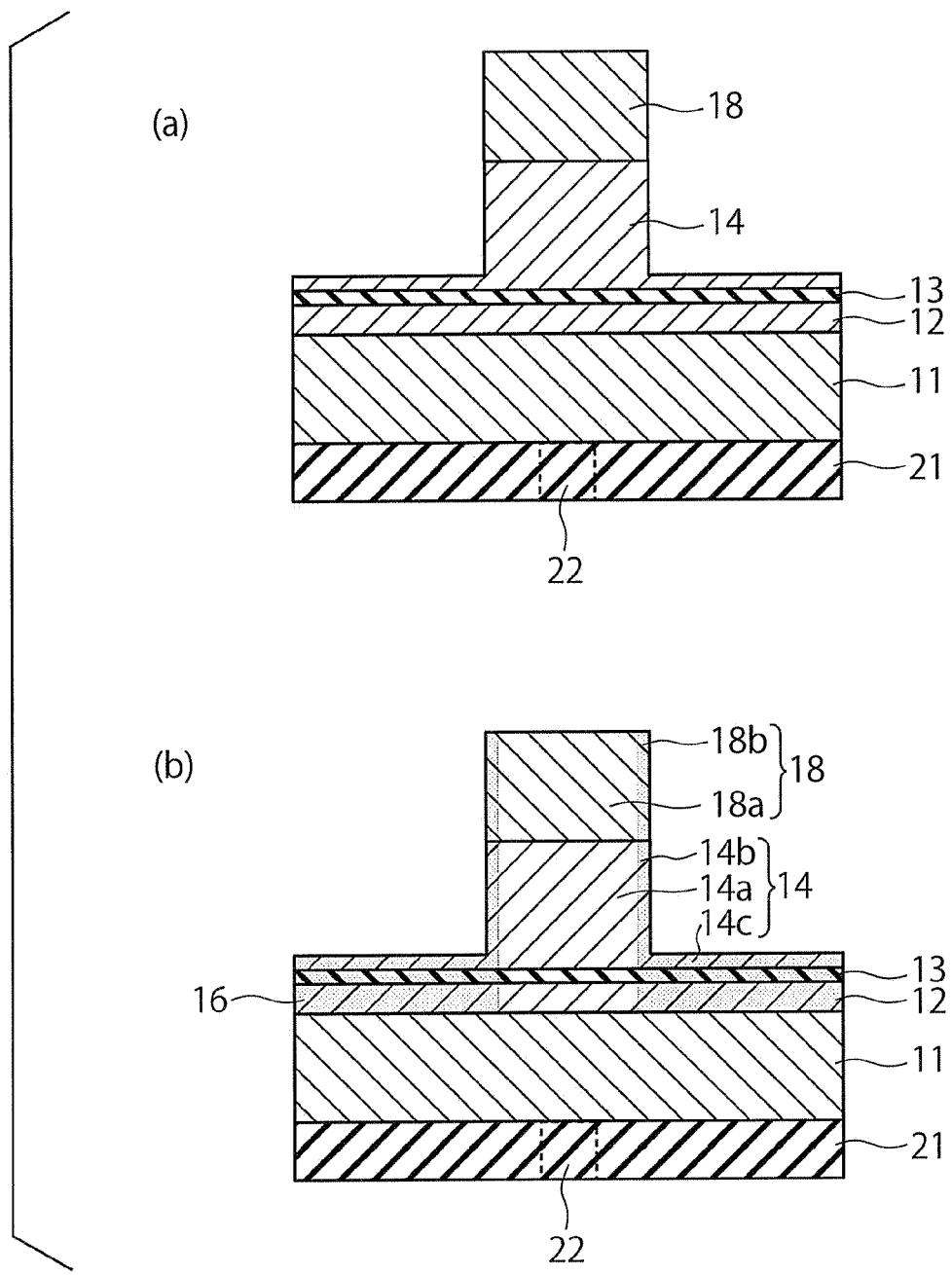
FIGS. 10(a) and 10(b) are cross-sectional views illustrating a manufacturing method according to the second embodiment.
Figure 11:
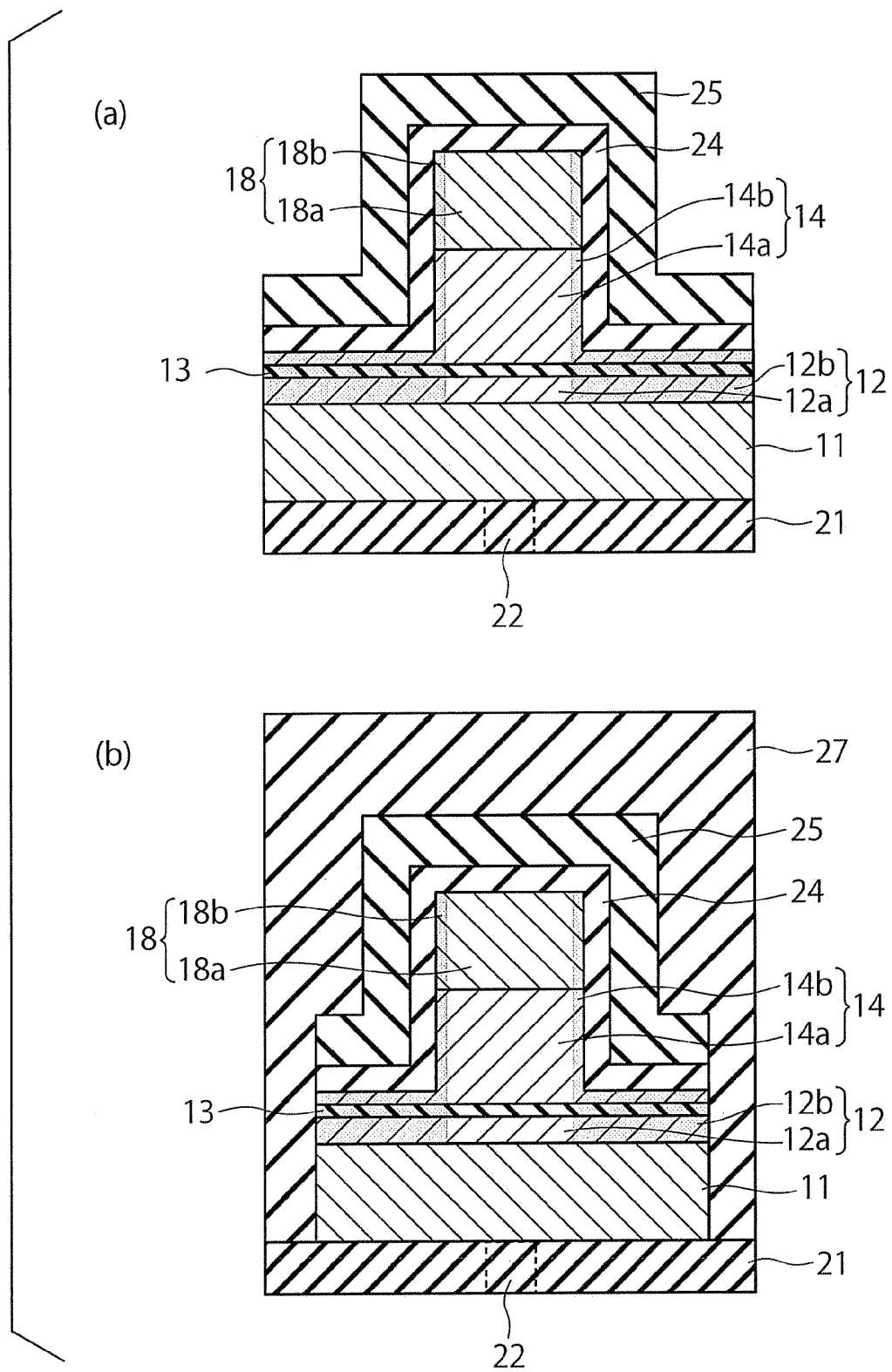
FIGS. 11(a) and 11(b) are cross-sectional views illustrating a manufacturing method according to the second embodiment.
Figure 12:
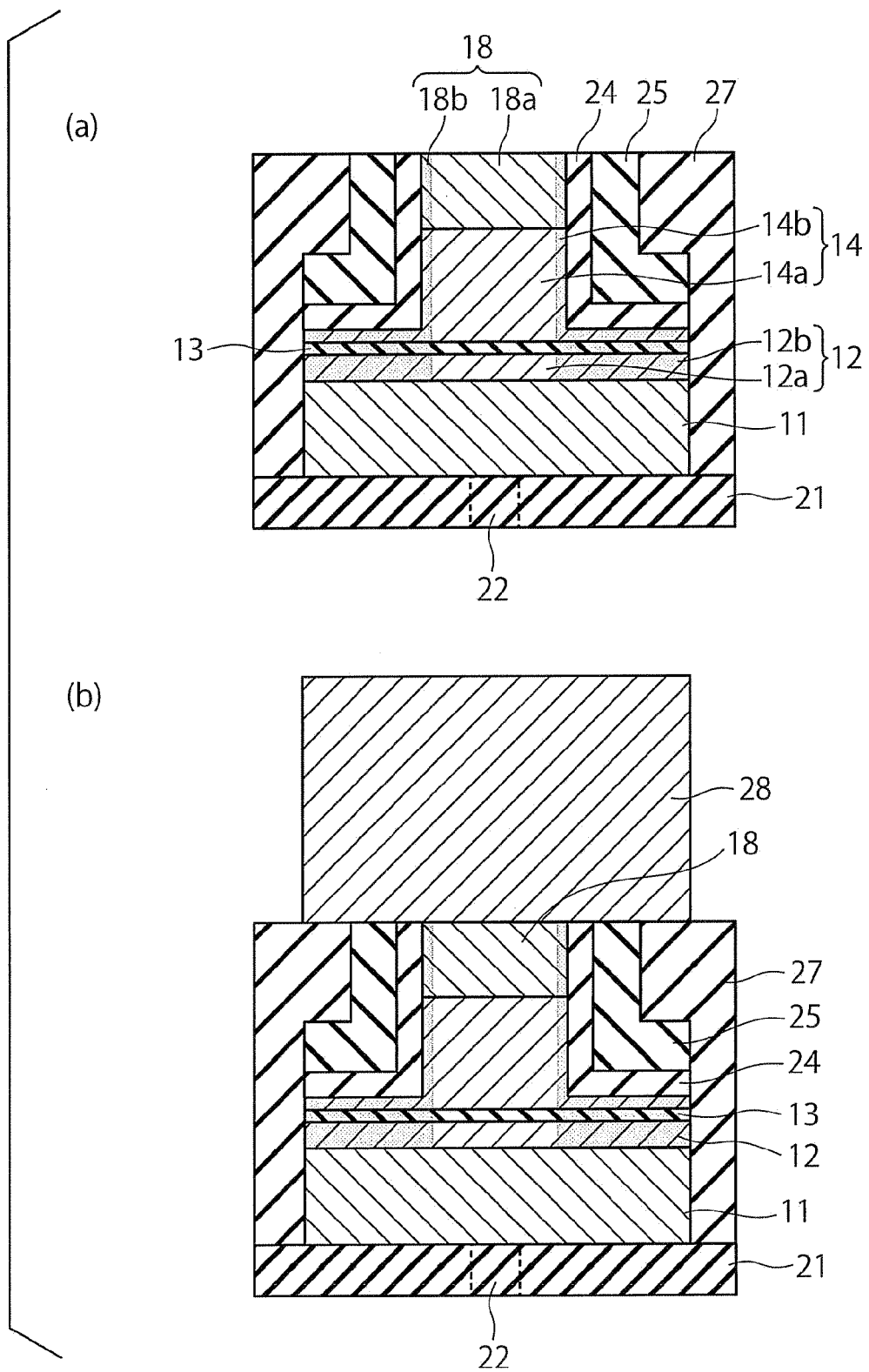
FIGS. 12(a) and 12(b) are cross-sectional views illustrating a manufacturing method according to the second embodiment.

First, as shown in FIG. 9(a), an interlayer insulating film 21 is formed on a MOS transistor and a front end of line (FEOL) that are formed on a semiconductor substrate (not shown). A contact 22 to be electrically connected to a lower interconnect or the MOS transistor or the like is formed in the interlayer insulating film 21. FIGS. 9(a) through 12(b) are cross-sectional views of the position in which the magnetoresistive element 10 is to be formed. After that, the upper face of the interlayer insulating film 21 is flattened by CMP (Chemical Mechanical Polishing) and etchback. The interlayer insulating film 21 may be a silicon oxide ($SiO_2$) layer, for example, and the contact 22 may be made of tungsten (W), for example.

As shown in FIG. 9(b), the base layer 11 including the lower electrode, the recording layer 12, the tunnel barrier layer 13, the reference layer 14, and the hard mask layer 18 serving as the upper electrode are then sequentially formed to cover the contact 22 by a sputtering technique, for example. The base layer 11 is a necessary layer for connecting to the contact 22 and growing flat magnetic layers having perpendicular magnetization, and is made of the materials described above. Examples of the materials of the recording layer 12 and the reference layer 14 include a ferromagnetic material having a $L1_0$ structure or a $L1_1$ structure such as FePd, FePt, CoPd, or CoPt, a ferromagnetic material such as TbCoFe, and a superlattice formed by a stacked structure of a magnetic material such as NiFe or Co and a nonmagnetic material such as Cu, Pd, or Pt. The tunnel barrier layer 13 may be a magnesium oxide (MgO) layer, for example. The hard mask layer 18 may be a tantalum (Ta) layer, for example. In some cases, the bias layer that is shown in FIG. 3 and serves to cancel a leak field from the reference layer 14 may be provided between the reference layer 14 and the hard mask layer 18, and the base layer 11 may also include a bias layer.

Device separation is then performed by using a known lithography technique or a known etching technique. A mask (not shown) made of a photoresist is formed on the hard mask layer 18. Using the mask, patterning is performed on the hard mask layer 18 and down to a middle portion of the reference layer 14 by anisotropic etching (RIE (Reactive Ion Etching), for example), as shown in FIG. 10(a). It should be noted that the patterning may not be performed on the reference layer 14, and may be performed only on the hard mask layer 18.

N ions and O ions are then implanted into the etched surface through ion implantation, as shown in FIG. 10(b). In the ion implantation process, the regions 14b and 12b that are made nonmagnetic and are made to have high resistance are formed in the reference layer 14 and the recording layer 12 located below the etched surface. Further, the active regions 14a and 12a are formed inside the regions 14b and 12b of the reference layer 14 and the recording layer 12, respectively. Through the ion implantation process, the unetched portion 14c of the reference layer 14 and the unetched sidewall portions 18b of the hard mask layer 18 are made nonmagnetic and are made to have high resistance. In FIG. 10(b), the diameter $\phi_{Reff}$ of the magnetically-active and electrically-active region 14a of the reference layer 14 and the diameter $\phi_{Seff}$ of the magnetically-active and electrically-active region 12a of the recording layer 12 are designed to be substantially the same from the upper face to the lower face.

However, as described in the first modification, the fourth modification, the fifth modification, and the sixth modification of the first embodiment (see FIGS. 2, 5, 7, and 8), the diameter $\phi_{Seff}$ of the magnetically-active and electrically-active center region 12a of the recording layer 12 may be smaller than the diameter $\phi_{Reff}$ of the magnetically-active and electrically-active center region 14a of the reference layer 14. In such a case, the spreading of the implanted ions in the horizontal direction is utilized by controlling the ion implantation conditions, and the spreading of the implanted ions in the horizontal direction is accelerated by performing annealing after the ion implantation. Thus, a desired impurity distribution is formed. In the ion implantation process, instead of unimolecular ions implanted by a conventional ion implantation device, cluster ions implanted by a gas-cluster ion beam device can be used. It is also possible to use positive ions that are emitted from a plasma etching device using a plasma source such as a parallel plate, magnetrons, or ICP, or positive ions that are emitted from a grid-extraction ion beam etching device. Those ion implantation processes are selected depending on the required ion energy determined by the depth of the region that is to be made nonmagnetic and is to be made to have high resistance. The ion energy selection depends greatly on the stacked structure of a subject MTJ. For example, when the stacked structure is made of Co-based magnetic metals up to the surface, the ion energy should be set at approximately 1 keV if the depth of the center of the region that is to be made nonmagnetic and is to be made to have high resistance is approximately 2 nm. However, when the region including the MgO tunnel barrier layer 13 is to be made nonmagnetic and is to be made to have high resistance, as shown in FIG. 1, the required ion energy and the required ion dose amount are larger than those required when the stacked structure is made of only magnetic metals. Further, the material that is to be made nonmagnetic and is to be made to have high resistance is a Co-based magnetic metal, a significant amount of ions are reflected at the time of ion implantation if elements with large mass numbers such as Ir, Ta, W, or Ru are stacked below the Co-based magnetic metal. Accordingly, ion implantation can be concentrated onto the target magnetic metal, and the material can be made nonmagnetic and can be made to have high resistance with a smaller dose amount.

Examples of elements to be implanted to make the recording layer 12 and the reference layer 14 magnetically and electrically inactive include N, He, F, O, Si, B, C, Zr, Tb, and Ti.

It should be noted that, instead of ion implantation, an N (nitrogen) beam may be emitted from a point in the vicinity of the surface of the reference layer 14.

As shown in FIG. 11(a), a thin insulating film 24 is then formed to cover the surface of the stack film consisting of the base layer 11, the recording layer 12, the tunnel barrier layer 13, the reference layer 14, and the hard mask layer 18. The insulating film 24 is made thin, so as not to form a space between the stack film and the insulating film 24. If there is a space, the space expands due to the heat treatment performed later. The expanded space might damage the magnetoresistive element 10, and degrade the characteristics of the magnetoresistive element 10. After the insulating film 24 is formed, an interlayer insulating film 25 made of silicon oxide ($SiO_2$) or silicon nitride (SiN), for example, is deposited on the entire surface. The upper face of the interlayer insulating film 25 is then flattened by chemical mechanical polishing (CMP), for example.

As shown in FIG. 11(b), a mask (not shown) made of a photoresist, for example, is formed on the flattened upper face of the interlayer insulating film 25, to electrically separate the magnetoresistive element 10 from the adjacent memory cells. Using this mask, patterning is performed on the interlayer insulating film 25, the insulating film 24, the reference layer 14, the tunnel barrier layer 13, the recording layer 12, and the base layer 11 by anisotropy etching. After that, an interlayer insulating film 27 is deposited to cover the interlayer insulating film 25, the insulating film 24, the reference layer 14, the tunnel barrier layer 13, the recording layer 12, and the base layer 11, which have been subjected to the patterning.

As shown in FIG. 12(a), the interlayer insulating film 27 is then flattened by CMP. Further, the interlayer insulating film 27, the interlayer insulating film 25, and the insulating film 24 are also trimmed, to expose the upper face of the hard mask layer 18 on the MTJ film.

As shown in FIG. 12(b), an upper interconnect 28 to be electrically connected to the hard mask layer 18 is formed on the magnetoresistive element 10. The upper interconnect 28 may be made of aluminum (Al) or copper (Cu), for example. Thus, a memory cell of the MRAM of the first embodiment is formed by the manufacturing method according to this embodiment.

In the MRAM manufactured by the manufacturing method according to this embodiment, degradation of the spin torque transfer switching characteristics of magnetoresistive elements used in memory cells can be restrained. Further, the magnetoresistive elements are manufactured with a high yield. Accordingly, MRAMs manufactured by the manufacturing method according to this embodiment have high productivity.

According to this embodiment, a MRAM can be formed by using magnetoresistive elements according to one of the first embodiment and its modifications. The magnetoresistive element can be used not only in spin-injection magnetic memories but also in magnetic memories of a domain wall displacement type.

Third Embodiment

Figure 13:
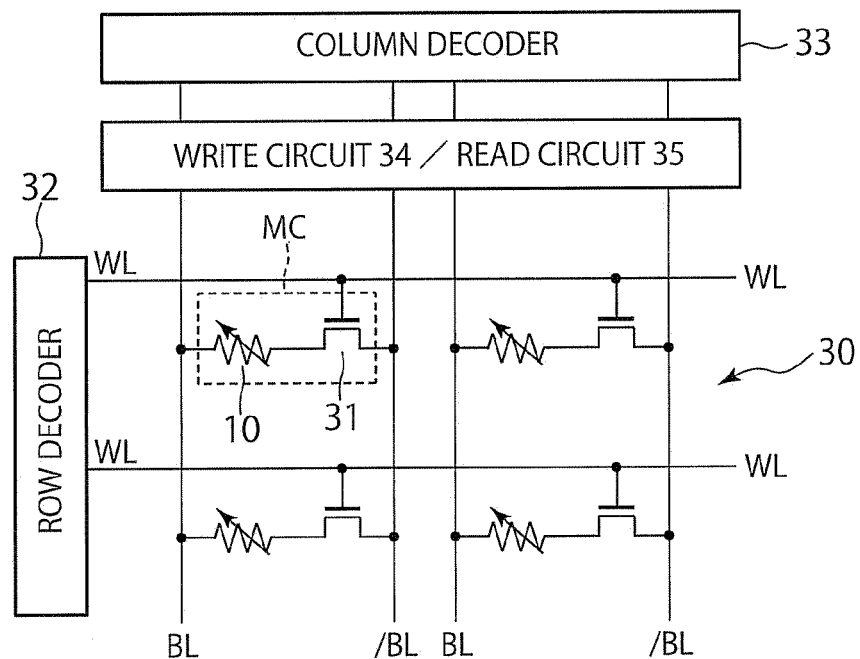
FIG. 13 is a circuit diagram of a magnetic memory according to a third embodiment.
Figure 14:
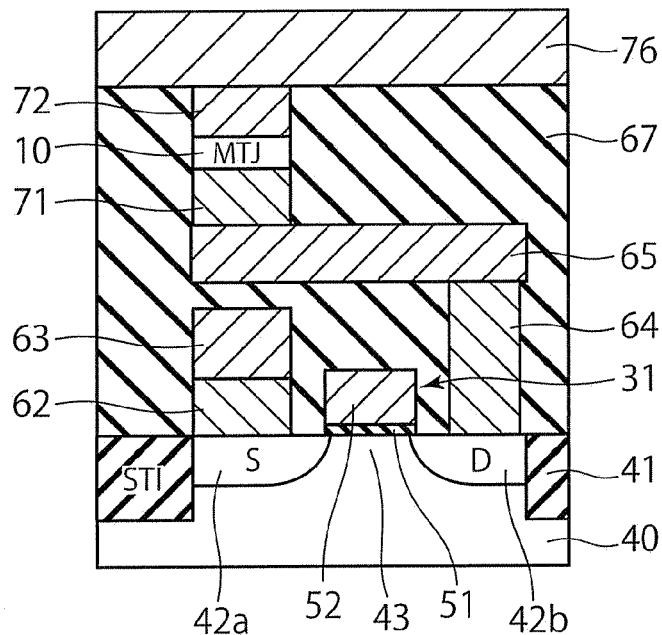
FIG. 14 is a cross-sectional view of a memory cell in the magnetic memory according to the third embodiment.

Referring now to FIGS. 13 and 14, a magnetic memory (MRAM) according to a third embodiment is described.

FIG. 13 is a circuit diagram of the MRAM according to this embodiment. The MRAM of this embodiment uses the magnetoresistive element shown in one of FIGS. 1 through 5 and FIGS. 7 and 8 as the memory element of a memory cell. In the following, an example case where the magnetoresistive element 10 according to the first embodiment is used as a memory element is described.

This MRAM includes a memory cell array 30 that has memory cells MC arranged in a matrix fashion. In the memory cell array 30, bit line pairs BL and /BL are arranged to extend in the column direction. In the memory cell array 30, word lines WL are also arranged to extend in the row direction.

The memory cells MC are positioned at the intersections between the bit lines BL and the word lines WL. Each of the memory cells MC includes the magnetoresistive element 10 and a select transistor 31 that is an n-channel MOS transistor. One end of the magnetoresistive element 10 is connected to the corresponding bit line BL. The other end of the magnetoresistive element is connected to the drain terminal of the select transistor 31. The gate terminal of the select transistor 31 is connected to the corresponding word line WL. The source terminal of the select transistor 31 is connected to the corresponding bit line /BL.

A row decoder 32 is connected to the word lines WL. A write circuit 34 and a read circuit 35 are connected to the bit line pairs BL and /BL. A column decoder 33 is connected to the write circuit 34 and the read circuit 35. Each of the memory cells MC is selected through the row decoder 32 and the column decoder 33.

Data writing into a memory cell MC is performed as follows. First, to select the memory cell MC on which data writing is to be performed, the word line WL connected to the memory cell MC is activated. As a result of this, the select transistor 31 of the selected memory cell MC is put into an ON state. At this point, a bidirectional write current Iw is supplied to the magnetoresistive element 10 in accordance with the write data. Specifically, when the write current Iw is supplied to the magnetoresistive element 10 from left to right in FIG. 13, the write circuit 34 applies a positive voltage to the bit line BL, and applies a ground voltage to the bit line /BL. When the write current Iw is supplied to the magnetoresistive element 10 from right to left in FIG. 13, the write circuit 34 applies a positive voltage to the bit line /BL, and applies the ground voltage to the bit line BL. Thus, data "0" or data "1" can be written into the memory cell MC.

Data reading from a memory cell MC is performed as follows. First, to select the memory cell MC from which data is to be read, the word line WL connected to the memory cell MC is activated. As a result of this, the select transistor 31 of the selected memory cell MC is put into an ON state. The read circuit 35 supplies a read current Ir flowing from right to left in FIG. 13, for example, to the magnetoresistive element 10. Based on the read current Ir, the read circuit 35 detects the resistance value of the magnetoresistive element 10. Thus, the data stored in the magnetoresistive element 10 can be read out.

Next, the structure of the MRAM is described. FIG. 14 is a cross-sectional view of the MRAM, mainly showing a memory cell MC.

A device isolation insulating layer 41 is formed in the surface region of a p-type semiconductor substrate 40, and the portion of the surface region of the semiconductor substrate 40 in which the device isolation insulating layer 41 is not formed is to serve as the device region (the active area) in which a magnetoresistive element is to be formed. The device isolation insulating layer 41 is formed with shallow trench isolation (STI), for example. Silicon oxide is used for the STI.

The select transistor 31 is formed in the device region of the semiconductor substrate 40. The select transistor 31 has a source region 42a and a drain region 42b that are separated from each other. Each of the source region 42a and the drain region 42b is an n$^+$-type diffusion region formed by implanting high-concentration n$^+$-type impurities into the semiconductor substrate 40. A gate insulating film 51 is formed on a region of the semiconductor substrate 40, and the region is to serve as the channel 43 located between the source region 42a and the drain region 42b. A gate electrode 52 is formed on the gate insulating film 51.

The gate electrode 52 functions as the word line WL.

An interconnect layer 63 is formed above the source region 42a via a contact 62. The interconnect layer 63 functions as the bit line /BL. A leading wire 65 is formed above the drain region 42b via a contact 64. The magnetoresistive element 10 interposed between a lower electrode 71 and an upper electrode 72 is provided above the leading wire 65. An interconnect layer 76 is formed on the upper electrode 72. The interconnect layer 76 functions as the bit line BL. The space between the semiconductor substrate 40 and the interconnect layer 76 is filled with an interlayer insulating film 67 made of silicon oxide, for example.

According to this embodiment, a MRAM can be formed by using magnetoresistive elements according to one of the first embodiment and its modifications. Those magnetoresistive elements can be used not only in spin-injection magnetic memories but also in magnetic memories of a domain wall displacement type.

In this embodiment, degradation of the spin torque transfer switching characteristics of magnetoresistive elements used in memory cells can be restrained, and the magnetoresistive elements can be manufactured with a high yield.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic memory comprising
at least one memory cell comprising a magnetoresistive element as a memory element, first and second electrodes that energize the magnetoresistive element, and an insulating film covering the magnetoresistive element,
the magnetoresistive element comprising: a first magnetic layer having a variable magnetization direction perpendicular to a film plane; a tunnel barrier layer on the first magnetic layer; and a second magnetic layer on the tunnel barrier layer, and having a fixed magnetization direction perpendicular to the film plane,
the first magnetic layer comprising: a first region; and a second region outside the first region so as to surround the first region, and having a smaller perpendicular magnetic anisotropy energy than that of the first region,
the second magnetic layer comprising: a third region; and a fourth region outside the third region so as to surround the third region, and having a smaller perpendicular magnetic anisotropy energy than that of the third region, wherein a mean size of the second region in a film thickness direction is larger than a mean size of the fourth region in the film thickness direction.

2. The magnetic memory according to claim 1, wherein
the second region comprises an element contained in the first region, and another element different from the element; and
the fourth region comprises an element contained in the third region, and the another element.

3. The magnetic memory according to claim 1, wherein a diameter of the first region is equal to or smaller than a diameter of the third region.

4. The magnetic memory according to claim 1, wherein the another element is at least one of N, He, F, O, Si, B, C, Zr, Tb, and Ti.

5. The magnetic memory according to claim 4, wherein a concentration of the another element in the second and fourth regions is 1 atomic % or higher.

6. The magnetic memory according to claim 1, further comprising
a third magnetic layer located on the opposite side of the second magnetic layer from the tunnel barrier layer, and having a magnetization direction that is perpendicular to the film plane and is the opposite of the magnetization direction of the second magnetic layer.

7. The magnetic memory according to claim 1, wherein a mean size of the second region in a film thickness direction thereof is larger than a mean size of the fourth region in a film thickness direction thereof.

8. The magnetic memory according to claim 1, wherein sidewalls of the first magnetic layer, sidewalls of the tunnel barrier layer, and part of sidewalls of the second magnetic layer form a tapered shape that becomes narrower in cross-section from the first magnetic layer toward the second magnetic layer.

9. The magnetic memory according to claim 1, wherein the following relationship is satisfied in the second region:

$$Ku \leq 2\pi Ms^2$$

where Ku represents the perpendicular magnetic anisotropy energy of the second region, and Ms represents saturation magnetization of the second region.

10. The magnetic memory according to claim 1, wherein
the first and third regions are electrically active, and
the second and fourth regions are electrically inactive.

11. The magnetic memory according to claim 1, wherein
the second magnetic layer comprises a first portion formed on the tunnel barrier layer, and a second portion formed on the first portion, the second portion having a cross-sectional area increasing from an upper face of the second magnetic layer toward the first portion, the cross-sectional area being in a plane perpendicular to the film plane.

12. The magnetic memory according to claim 1, further comprising:
a first interconnect electrically connected to the first electrode; and
a second interconnect electrically connected to the second electrode.

13. The magnetic memory according to claim 12, further comprising
a select transistor provided between the first electrode and the first interconnect or between the second electrode and the second interconnect.

* * * * *